(12) United States Patent
Nakagawa et al.

(10) Patent No.: US 8,415,753 B2
(45) Date of Patent: Apr. 9, 2013

(54) SEMICONDUCTOR DEVICE AND METHOD OF MANUFACTURING THE SAME

(75) Inventors: Takashi Nakagawa, Hachiouj (JP); Naomu Kitano, Machida (JP); Kazuaki Matsuo, Tokyo (JP); Motomu Kosuda, Machida (JP); Toru Tatsumi, Tokyo (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/264,955

(22) PCT Filed: Apr. 28, 2010

(86) PCT No.: PCT/JP2010/003038
§ 371 (c)(1),
(2), (4) Date: Oct. 17, 2011

(87) PCT Pub. No.: WO2010/125810
PCT Pub. Date: Nov. 4, 2010

(65) Prior Publication Data
US 2012/0043617 A1    Feb. 23, 2012

(30) Foreign Application Priority Data
Apr. 28, 2009   (JP) .................. 2009-108996

(51) Int. Cl.
*H01L 27/092* (2006.01)
*H01L 21/336* (2006.01)

(52) U.S. Cl.
USPC ....... 257/412; 257/E29.16; 438/198; 438/653

(58) Field of Classification Search .......... 257/412, 257/369, E29.16, 368, E21.409; 438/198, 438/216, 605, 653
See application file for complete search history.

(56) References Cited

U.S. PATENT DOCUMENTS
6,242,804 B1   6/2001   Inoue
6,271,573 B1   8/2001   Suguro
(Continued)

FOREIGN PATENT DOCUMENTS
| JP | 8-250452 A | 9/1996 |
| JP | 10-125627 A | 5/1998 |
| JP | 11-162873 A | 6/1999 |
| JP | 2001-203276 A | 7/2001 |

(Continued)

OTHER PUBLICATIONS

PCT International Search Report of the International Searching Authority, International Application No. PCT/JP2010/003038, Mailing Date Jun. 1, 2010.

*Primary Examiner* — Matthew Reames
*Assistant Examiner* — John Bodnar
(74) *Attorney, Agent, or Firm* — Fitzpatrick, Cella, Harper & Scinto

(57) ABSTRACT

This invention provides a semiconductor device having a field effect transistor comprising a gate electrode comprising a metal nitride layer and a polycrystalline silicon layer, and the gate electrode is excellent in thermal stability and realizes a desired work function. In the semiconductor device, a gate insulating film 6 on a silicon substrate 5 has a high-permittivity insulating film formed of a metal oxide, a metal silicate, a metal oxide introduced with nitrogen, or a metal silicate introduced with nitrogen, the gate electrode has a first metal nitride layer 7 provided on the gate insulating film 6 and containing Ti and N, a second metal nitride layer 8 containing Ti and N, and a polycrystalline silicon layer 9, in the first metal nitride layer 7, a molar ratio between Ti and N (N/Ti) is not less than 1.1, and a crystalline orientation X1 is $1.1 < X1 < 1.8$, and in the second metal nitride layer 8, the molar ratio between Ti and N (N/Ti) is not less than 1.1, and a crystalline orientation X2 is $1.8 \leq X2$.

13 Claims, 10 Drawing Sheets

U.S. PATENT DOCUMENTS

| | | |
|---|---|---|
| 6,344,411 B1 | 2/2002 | Yamada et al. |
| 6,483,151 B2 | 11/2002 | Wakabayashi et al. |
| 8,026,143 B2 | 9/2011 | Kitano et al. |
| 2008/0121999 A1 | 5/2008 | Kawahara et al. |
| 2009/0057787 A1 | 3/2009 | Matsuki et al. |

FOREIGN PATENT DOCUMENTS

| | | |
|---|---|---|
| JP | 3523093 B2 | 4/2004 |
| JP | 3540613 B2 | 7/2004 |
| JP | 2008-16538 A | 1/2008 |
| JP | 2008-240095 A | 10/2008 |
| JP | 2009-59882 A | 3/2009 |

SEMICONDUCTOR DEVICE AND METHOD OF MANUFACTURING THE SAME

This application is a National Stage application under 35 U.S.C. §371 of International Application No. PCT/JP2010/003038, filed on Apr. 28, 2010, which claims priority to Japanese Application No. 2009-108996, filed Apr. 28, 2009, the contents of each of the foregoing applications being incorporated by reference herein.

TECHNICAL FIELD

This invention relates to a semiconductor device, which has a high-permittivity insulating film and a metal gate electrode, a method of manufacturing the semiconductor device, and a manufacturing program, and relates particularly to a technique for improving the performance of an MOSFET (Metal Oxide Semiconductor Field Effect Transistor).

BACKGROUND ART

In advanced CMOS (complementary MOS) device development realized miniaturization of a transistor, deterioration of a drive current due to depletion of a polysilicon (poly-Si) electrode and increase in gate current due to thinning of a gate insulating film become problems. Thus, there has been studied a complex technology for preventing the depletion of the electrode by the application of a metal gate, and, at the same time, increasing a physical film thickness by using a high permittivity material in a gate insulating film to thereby reduce gate leak current. For example, a pure metal, a metal nitride, or a silicide material has been considered as a material used in a metal gate electrode. However, in any case, a threshold value voltage (Vth) of an N-type MOSFET and a P-type MOSFET must be able to be set to an appropriate value. When a conventional gate electrode with interposition of a polycrystalline silicon layer is used, the threshold value voltage of a transistor is determined by an impurity concentration of a channel region and an impurity concentration in the polycrystalline silicon film. Meanwhile, when a metal gate electrode is used, the threshold value voltage of the transistor is determined by the impurity concentration of the channel region and a work function of a gate electrode. To realize Vth of not more than ±0.5V in a CMOS transistor, for the N-type MOSFET, a material with a work function of not more than the mid-gap of Si (4.6 eV), preferably not more than 4.4 eV is required to be used in the gate electrode, and for the P-type MOSFET, a material with a work function of not less than the mid-gap of Si (4.6 eV), preferably not less than 4.8 eV is required to be used in the gate electrode.

As the means for realizing this, there has been considered a metal inserted Poly-Si stacked structure (MIPS: Metal-inserted Poly-silicon Stack) having a high consistency with an existing CMOS fabrication process. In this method, a gate electrode with a metal film inserted in between Poly-Si and a gate insulating film is formed, and the threshold value voltage is regulated by the work function of the inserted gate electrode. At this time, there is a problem that the work function of the metal film is changed by a mutual reaction with the gate insulating film and Poly-Si in a heat treatment process.

For example, Patent Document 1 discloses a method using a gate electrode having a stacked structure of polycrystalline silicon, PVD-TiN (second metal layer), and CVD-TiN (first metal layer). The Patent Document 1 discloses that according to this method, TiN which is the first metal layer is formed at a low temperature of not more than 450° C. by a thermal CVD method using $TiCl_4$ and $NH_3$, whereby TiN suitable for a metal gate of the P-type MOSFET and having a work function of not less than 4.8 eV can be realized. The Patent Document 1 further discloses that TiN which is the second metal layer is formed at 500° C. (higher than the temperature when TiN as the first metal layer is formed) by a PVD method, whereby TiN oriented in a (100) plane is formed. The Patent Document 1 further discloses that TiN oriented in the (100) plane has an effect of suppressing reduction of the work function due to the diffusion of Si from Poly-Si to TiN in a thermal treatment (for example, an activation annealing process) after formation of a gate electrode.

Patent Document 2 discloses a method using a metal gate electrode whose portion in contact with a gate insulating film has an average crystal grain size of not more than 30 nm. The Patent Document 2 discloses that according to this method, when TiN formed by a sputtering method is used as a gate electrode, for instance, formation is performed to control the voltage-dividing ratio between Ar and nitrogen so that at a film-formation temperature of not more than 300° C., the ratio between Ti and N is not 1:1, but the amount of nitrogen is excess, whereby the grain diameter of TiN is not more than 30 nm, and it is possible to suppress a variation of the threshold value voltage of a transistor. The Patent Document 2 further discloses that for the crystal structure of TiN, when a (111) oriented TiN film is used, the variation of the threshold value voltages is small in comparison with the case of using a TiN film in which (111) orientation and (110) orientation coexist.

Patent Document 3 discloses a method of aligning the plane directions of a metal gate electrode of a portion in contact with a gate insulating film. The Patent Document 3 discloses that the work function of TiN is changed by the crystalline orientation of TiN, and the work function is 4.3 eV in the (100) orientation and is 4.6 eV in the (111) orientation.

Patent Document 4 discloses, as a method of changing the work function of TiN, a technique for changing the work function by a nitrogen concentration of titanium nitride, using a gate electrode having a stacked structure of high-melting-point metals such as TiN and tungsten. The Patent Document 4 discloses that according to this method, the work function can be reduced by the increase of the flow ratio of nitrogen gas in the formation of TiN by ion implantation of nitrogen into a TiN film and reactive sputtering and by the increase of the percentage of nitrogen contained in the TiN film. The Patent Document 4 further discloses that the nitrogen content percentage in the reactive sputtering is 100%, so that the crystalline orientation of the TiN film is changed to (200) substantially, whereby TiN with a low work function suitable for a gate electrode of an N-type channel MOSFET can be obtained.

Patent Document 5 discloses a method of suppressing a reaction occurring between a gate electrode using TiN and a high-permittivity gate insulating film. The Patent Document 5 discloses that according to this method, in the gate electrode having a stacked structure of TiN and tungsten, the film density of TiN is not less than 5.0 $g/cm^3$, the crystal structure is the (100) orientation, and a film composition Ti/N is set within a range of 1.0 to 1.2, whereby the mutual reaction between TiN and the high-permittivity gate insulating film can be suppressed.

PRIOR ART DOCUMENTS

Patent Documents
Patent Document 1: Japanese Patent Application Laid-Open No. 2008-16538
Patent Document 2: Japanese Patent No. 3523093

Patent Document 3: Japanese Patent No. 3540613
Patent Document 4: Japanese Patent Application Laid-Open No. 2001-203276
Patent Document 5: Japanese Patent Laid-Open No. 2009-59882

SUMMARY OF THE INVENTION

Problems to be Solved by the Invention

However, the above techniques have the following problems.

The method described in the Patent Document 1 is an effective technique in that TiN having a high work function is realized, and, at the same time, it is possible to suppress the reduction of the work function caused by the diffusion of Si from Poly-Si to TiN in the thermal treatment after the formation of the gate electrode; however, this method does not describe each film composition of TiN, and there is a problem that the work function is changed by the composition. In addition, an optimal crystalline orientation of TiN in a region in contact with a gate insulating film is not known. Further, there is a problem that after TiN having a high work function is formed by a CVD method, TiN capable of suppressing the diffusion of Si is formed by the PVD method, and therefore, the number of processes of producing a gate electrode is increased. To form TiN capable of suppressing the diffusion of Si by the PVD method, the film formation is required to be performed under a high temperature of approximately 500° C., and therefore, there is concern about throughput degradation.

The methods of controlling the crystal grain size and crystalline orientation of the TiN film described in the Patent Documents 2 and 3 do not state the film composition for obtaining the optimal work function and a change of the work function due to the mutual reaction with the gate insulating film and Poly-Si in the case of using as a metal film for MIPS.

Although the method described in the Patent Document 4 is an effective technique capable of controlling the work function by the nitrogen concentration of titanium nitride, the method does not state the change of the work function due to the mutual reaction with the gate insulating film and Poly-Si in the case of using as a metal film for MIPS. Since this method uses a silicon nitride film or a silicon oxynitride film as the gate insulating film, the Patent Document 4 does not state the film composition and crystalline orientation of the TiN film suitable for the high-permittivity gate insulating film.

The method of optimizing the film density, crystalline orientation, and film composition of the TiN film described in the Patent Document 5 is effective in that the reaction between TiN and the gate insulating film is suppressed; however, this method does not state the change of the work function due to the mutual reaction with the gate insulating film and Poly-Si in the case of using as a metal film for MIPS.

In view of the aforementioned conventional problems, this invention provides a semiconductor device, which optimizes the film composition and crystalline orientation of TiN using a more simplified manufacturing process to thereby enable to improve element characteristics, a method of manufacturing the semiconductor device, and a manufacturing program.

Means for Solving the Problems

A semiconductor device of this invention includes a field effect transistor provided on a silicon substrate and having a gate insulating film and a gate electrode provided on the gate insulating film. The semiconductor device is characterized in that
the gate insulating film includes a high-permittivity insulating film formed of a metal oxide, a metal silicate, a metal oxide introduced with nitrogen, or a metal silicate introduced with nitrogen,
the gate electrode has a first metal nitride layer provided on the gate insulating film and containing Ti and N, a second metal nitride layer provided on the first metal nitride layer and containing Ti and N, and a polycrystalline silicon layer provided on the second metal nitride layer,
in the first metal nitride layer, a molar ratio between Ti and N (N/Ti) is not less than 1.1, and a crystalline orientation $X_1$ is $1.1 < X_1 < 1.8$, and in the second metal nitride layer, the molar ratio between Ti and N (N/Ti) is not less than 1.1, and a crystalline orientation $X_2$ is $1.8 \leq X_2$.

In a method of manufacturing a semiconductor device of this invention, the semiconductor device includes a field effect transistor having a gate insulating film and a gate electrode on a silicon substrate. The gate insulating film includes a high-permittivity insulating film formed of a metal oxide, a metal silicate, a metal oxide introduced with nitrogen, or a metal silicate introduced with nitrogen. The gate electrode has a first metal nitride layer provided on the gate insulating film and containing Ti and N, a second metal nitride layer provided on the first metal nitride layer and containing Ti and N, and a polycrystalline silicon layer provided on the second metal nitride layer. The method is characterized by comprising
a process of forming the first metal nitride layer in which a molar ratio between Ti and N (N/Ti) is not less than 1.1, and a crystalline orientation $X_1$ is within a range of $1.1 < X_1 < 1.8$, and
a process of forming the second metal nitride layer in which the molar ratio between Ti and N (N/Ti) is not less than 1.1, and a crystalline orientation $X_2$ is $1.8 \leq X_2$.

In a program for manufacturing a semiconductor device of this invention, the semiconductor device includes a field effect transistor having a gate insulating film and a gate electrode on a silicon substrate. The gate insulating film has a high-permittivity insulating film formed of a metal oxide, a metal silicate, a metal oxide introduced with nitrogen, or a metal silicate introduced with nitrogen. The gate electrode has a first metal nitride layer provided on the gate insulating film and containing Ti and N, a second metal nitride layer provided on the first metal nitride layer and containing Ti and N, and a polycrystalline silicon layer provided on the second metal nitride layer. The program is characterized by causing a computer to execute
a procedure for forming the first metal nitride layer in which the molar ratio between Ti and N (N/Ti) is not less than 1.1, and a crystalline orientation $X_1$ is within a range of $1.1 < X_1 < 1.8$, and
a procedure for forming the second metal nitride layer in which the molar ratio between Ti and N (N/Ti) is not less than 1.1, and a crystalline orientation $X_2$ is $1.8 \leq X_2$.

EFFECTS OF THE INVENTION

According to this invention, it is possible to suppress reduction of a work function due to diffusion of Si from a polycrystalline silicon layer into a TiN film in a thermal treatment process after formation of a gate electrode without leading to deterioration of electric properties of an element.

MODES FOR CARRYING OUT THE INVENTION

Hereinafter, embodiments of this invention will be described in detail based on the drawings.

In a field effect transistor structure having a gate electrode provided on a high-permittivity gate insulating film and having a stacked structure of a metal nitride film formed of TiN and a polycrystalline silicon layer, the present inventors made intensive studies of a titanium nitride film structure that has a high work function and can suppress reduction of a work function in a thermal treatment process after formation of the gate electrode. As a result, there is adopted a titanium nitride film structure in which it has a stacked structure comprising a first metal nitride layer provided on the gate insulating film and a second metal nitride layer provided on the first metal nitride layer, a molar ratio between Ti and N (N/Ti) in the first metal nitride layer is not less than 1.1, a crystalline orientation $X_1$ is within a range of $1.1 < X_1 < 1.8$, the molar ratio between Ti and N (N/Ti) in the second metal nitride layer is not less than 1.1, and a crystalline orientation $X_2$ is set to $1.8 \leq X_2$. Consequently, the present inventors newly found that a gate electrode which can: (1) realize a high work function without reducing the performance of an element; and (2) suppress the reduction of the work function in the thermal treatment process after the formation of the gate electrode.

In this invention, the "crystalline orientation" means a ratio between a (200) peak intensity and a (111) peak intensity (C200)/C(111)) in an X-ray diffraction spectrum of a metal nitride layer containing Ti and N.

Figure 1:
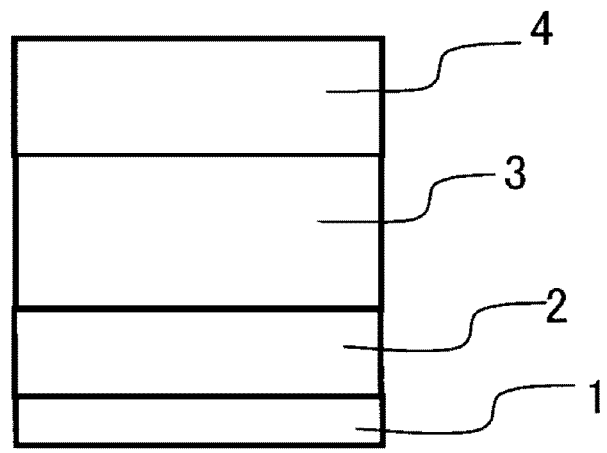
[FIG. 1] A cross-sectional view of an element structure according to an embodiment of this invention.

An embodiment of a titanium nitride film in this invention for use in realizing a high work function will be described using, as an example, an element having an MIPS type gate electrode of FIG. 1. As shown in FIG. 1, a titanium nitride film 3 and a silicon film 4 are formed on a p-type silicon substrate 1 having on its surface a gate insulating film 2 using a silicon oxide film and an HfSiO film as a high-permittivity film.

A high-permittivity material used in the gate insulating film 2 is a material having a relative permittivity larger than the relative permittivity of $SiO_2$ (3.9) and includes a metal oxide, a metal silicate, a metal oxide introduced with nitrogen, and a metal silicate introduced with nitrogen. Preferred is a high-permittivity film introduced with nitrogen in terms of suppressing crystallization and improving the reliability of an element. As a metal in the high-permittivity material, preferred is Hf or Zr in terms of the heat resistance of a film and the suppression of fixed charge in a film. As the high-permittivity material, preferred are a metal oxide containing Hf or Zr and Si and a metal oxynitride which is the metal oxide further containing nitrogen, and more preferred are HfSiO and HfSiON. In this embodiment, although a silicon oxide film and a high-permittivity film stacked on the silicon oxide film are used as the gate insulating film 2, the embodiment is not limited thereto, and a high-permittivity insulating film can be used alone, or silicon oxynitride film and the high-permittivity film stacked on the silicon oxide film can be used.

Figure 2:
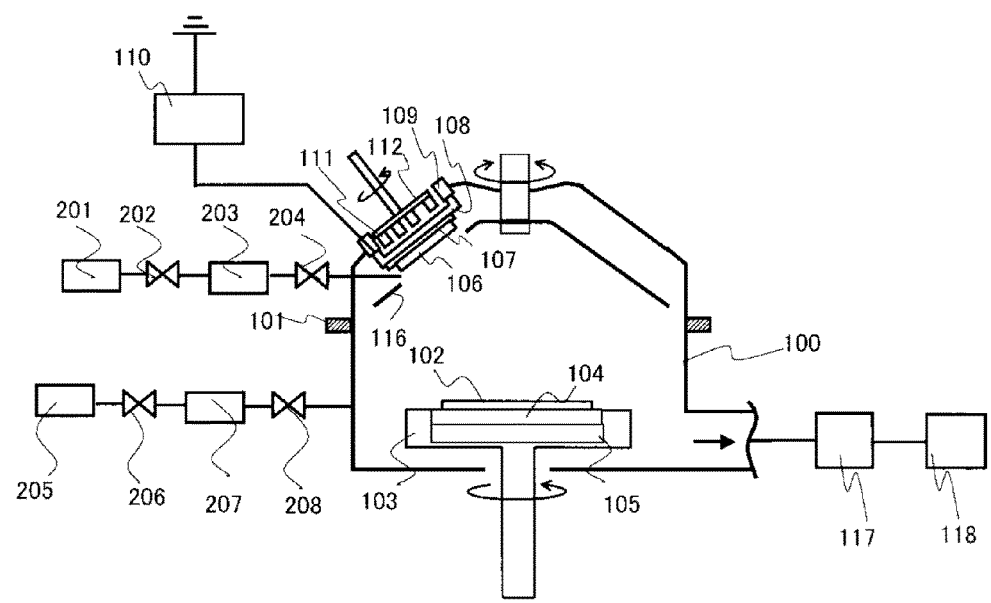
[FIG. 2] A schematic view of a processing apparatus used in a process of forming a titanium nitride film according to the embodiment of this invention.

FIG. 2 schematically shows a processing apparatus used in a process of forming the titanium nitride film 3 in this invention.

A film-formation treatment chamber 100 can be heated to a predetermined temperature by a heater 101. A treated substrate 102 can be heated to a predetermined temperature by a heater 105 through a susceptor 104 incorporated into a substrate support pedestal 103. It is preferable that the substrate support pedestal 103 can be rotated at a predetermined rotation number in terms of uniformity of film thickness. In the film-formation treatment chamber, a target 106 is provided at a position facing the treated substrate 102. The target 106 is provided at a target holder 108 through a back plate 107 formed of metal such as Cu. A form of a target assembly obtained by combining the target 106 and the back plate 107 is formed, as a single component, of a target material, and the form may be attached as a target. Namely, the target may be provided at a target holder. A DC power supply 110 applying power for sputtering discharge is connected to the target holder 108 formed of metal such as Cu, and the target holder 108 is insulated from the wall of the film-formation treatment chamber 100 at a ground potential by an insulator 109. A magnet 111 for use in realizing magnetron-sputtering is provided behind the target 106 as viewed from a sputtering surface. The magnets 111 may be aligned in any manner that generates magnetic flux lines (magnetic flux). The magnets 111 are held by a magnet holder 112 and can be rotated by a magnet holder rotation mechanism (not shown). To uniform erosion of a target, the magnets 111 rotate during discharge. The target 106 is provided at an offset position obliquely upward from the substrate 102. Namely, a center point of the sputtering surface of the target 106 is located at a position deviating by a predetermined dimension from the normal of the center point of the substrate 102. A shield 116 is provided between the target 106 and the treated substrate 102 to control film formation on the treated substrate 102 by sputtering particles emitted from the target 106 receiving electric power.

The Ti metal target 106 is used as a target. A titanium nitride film is deposited by supplying electric power to the metal target 106 by the DC power supply 110 through the target holder 108 and the back plate 107. At this time, an inert gas from an inert gas supply 201 is introduced from near the target into the film-formation treatment chamber 100 through a valve 202, a mass flow controller 203, and a valve 204. A reactive gas comprising nitrogen is introduced from a nitrogen gas supply 205 to near the substrate in the film-formation treatment chamber 100 through a valve 206, a mass flow controller 207, and a valve 208. The introduced inert gas and reactive gas are discharged by a exhaust pump 118 through a conductance valve 117.

In the deposition of the titanium nitride film 3 in this invention, argon is used as a sputtering gas, and nitrogen is used as a reactive gas. The substrate temperature can be suitably determined within a range of 27° C. to 600° C., the target power can be suitably determined within a range of 50 W to 1000 W, a sputtering gas pressure can be suitably determined within a range of 0.1 Pa to 1.0 Pa, an Ar flow rate can be suitably determined within a range of 0 sccm to 100 sccm (0 Pa·m$^3$/sec to $1.69\times10^{-1}$ Pa·m$^3$/sec), and a nitrogen gas flow rate can be suitably determined within a range of 0 sccm to 100 sccm (0 Pa·m$^3$/sec to $1.69\times10^{-1}$ Pa·m$^3$/sec). In this embodiment, in the deposition of the titanium nitride film 3, the substrate temperature is set to 30° C., the target power of Ti is set to 750 W, the sputtering gas pressure is set to 0.2 Pa, the argon gas flow rate is changed within a range of 0 sccm to 20 sccm (0 Pa·m$^3$/sec to $3.38\times10^{-2}$ Pa·m$^3$/sec), and the nitrogen gas flow rate is changed within a range of 2 sccm to 50 sccm ($3.38\times10^{-3}$ Pa·m$^3$/sec to $8.45'10^{-2}$ Pa·m$^3$/sec). The molar ratio between Ti elements and N elements in the titanium nitride film and the crystalline orientation are regulated by the blend ratio between argon and nitrogen introduced in the sputtering, using a controller 600 shown in FIGS. 16 and 17. The "molar ratio" in this specification means a ratio of the number of moles that is the base unit of the amount of material. The molar ratio between the Ti elements and the N elements can be measured from the binding energy of specific electrons in a material and the energy levels and amount of electrons by X-ray photoelectron spectroscopy, for example.

Next, a silicon film 4 of 20 nm is deposited on the deposited titanium nitride film 3 by a sputtering method.

Next, a produced sample is annealed for 2 min within a temperature range of 400° C. to 1000° C. in a nitrogen atmosphere.

Next, the TiN film 4 is processed to have a desired size using a lithography technique and an RIE (Reactive Ion Etching) technique, and an element having an MIPS type gate electrode is formed.

The composition of the deposited titanium nitride film is analyzed by X-ray photoelectron spectroscopy (XPS). The crystalline orientation of the titanium nitride film is analyzed by an X-ray diffraction (XRD) method. The film density is analyzed by an X-ray reflectivity technique (X-ray Reflect meter). Further, the electric properties including an effective work function, EOT (Equivalent Oxide Thickness, representing an SiO$_2$ equivalent film-thickness), and leak current characteristics are evaluated by C-V, I-V measurement. In this invention, the "effective work function" is generally obtained by a flat band by CV measurement between a gate insulating film and a gate electrode and is influenced by not only the original work function of the gate electrode but also a fixed charge in the insulating film, a dipole formed at the interface, a Fermi level pinning and so on. The effective work function is distinguished from the original "work function" of a material constituting the gate electrode (the energy required for taking an electron from Fermi level to vacuum level).

Next, EOT (oxide film equivalent film thickness) will be described. Regardless of the kind of insulating film, it is supposed that an insulating film material is a silicon oxide film, and an electric film thickness of an insulating film obtained by calculating back from the capacity is referred to as the oxide film equivalent film thickness. Namely, when the relative permittivity of the insulating film is ∈h, the relative permittivity of the silicon oxide film is ∈o, and the thickness of the insulating film is dh, the oxide film equivalent film thickness de is represented by the following formula (1):

$$de = dh \times (\epsilon o / \epsilon h) \quad (1)$$

The formula (1) shows that when a material having a relative permittivity ∈h larger than the relative permittivity ∈o of the silicon oxide film is used in the insulating film, the oxide film equivalent film thickness de is equivalent to the silicon oxide film thinner than the film-thickness dh of the insulating film. The relative permittivity ∈o of the silicon oxide film is approximately 3.9. Thus, for example, in a film constituted of a high-permittivity material in which ∈h=39, even if the physical film thickness dh is 15 nm, the oxide film equivalent film thickness (electric film thickness) de is 1.5 nm, and while the capacity value of the insulating film is kept equal to that of the silicon oxide film with a film-thickness of 1.5 nm, the leak current can be significantly reduced.

Figure 3:
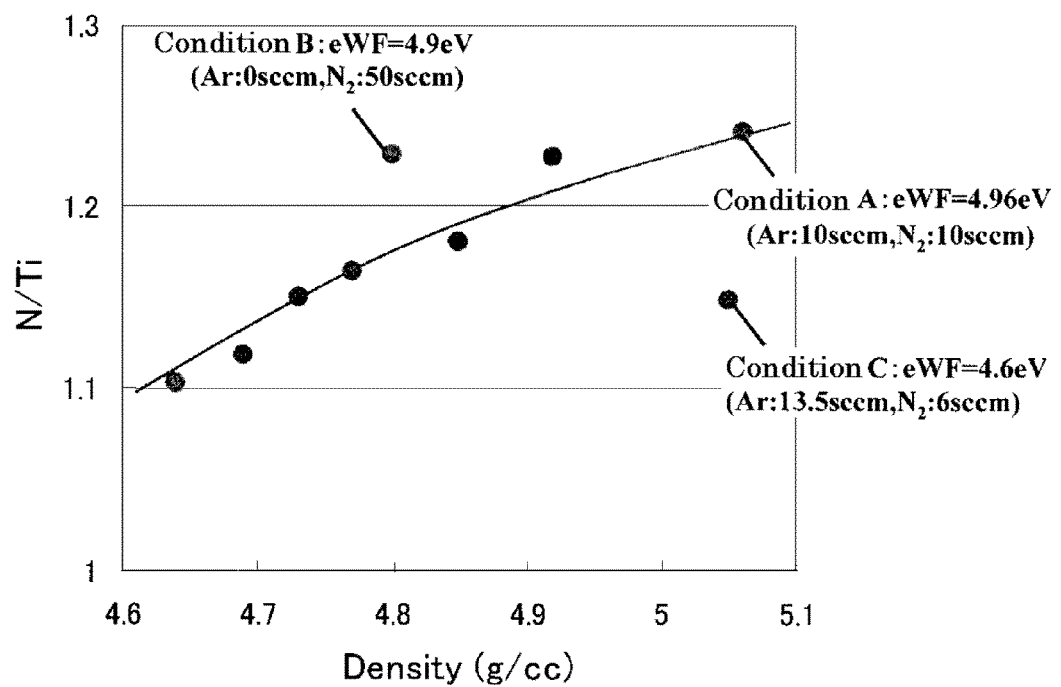
[FIG. 3] A view showing a relationship among the film composition, film density and effective work function of the titanium nitride film according to the embodiment of this invention.

FIG. 3 shows a relationship between the film composition (N/Ti ratio) (the molar ratio between Ti and N (N/Ti)) and film density of the titanium nitride film according to this invention. Further, in FIG. 3, conditions for forming titanium nitride (flow rates of argon gas and nitrogen gas) of major samples and the values of effective work function (eWf) of major samples in a state that heat treatment is not applied are shown. As shown in FIG. 3, a titanium nitride film formed under conditions where the flow rate of argon gas was 10 sccm ($1.69\times10^{-2}$ Pa·m$^3$/sec) and the flow rate of nitrogen gas was 10 sccm ($1.69\times10^{-2}$ Pa·m$^3$/sec) (condition A) had a film composition of N/Ti=1.24, a film density of 5.06 g/cc, and an effective work function (eWf) as high as 4.96 eV. Further, a titanium nitride film formed under conditions where the flow rate of argon gas was 0 sccm (0 Pa·m$^3$/sec) and the flow rate of nitrogen gas was 50 sccm ($8.45\times10^{-2}$ Pa·m$^3$/sec) (condition B) had a film composition of N/Ti=1.23, a film density of 4.8 g/cc, and an effective work function (eWF) as high as 4.9 eV. Further, a titanium nitride film formed under conditions where the flow rate of argon gas was 13.5 sccm ($2.28\times10^{-2}$ Pa·m$^3$/sec) and the flow rate of nitrogen gas was 6 sccm ($1.01\times10^{-2}$ Pa·m$^3$/sec) (condition C) had a film composition of N/Ti=1.15, a film density of 5.05 g/cc, and an effective work function (eWF) of 4.6 eV, which was lower than those of the films formed under the above conditions. As can be seen from FIG. 3, the film composition (N/Ti ratio), film density, and work function can be controlled by adjusting the flow rate of argon gas and the flow rate of nitrogen gas during sputtering. Moreover, it is clear that the effective work function of the titanium nitride film is related to not the film density but the film composition (N/Ti ratio). Thus, to obtain the work function of not less than 4.6 eV suitable for the P-type MOSFET, the N/Ti ratio is preferably not less than 1.1, and to obtain the work function of not less than 4.8 eV, the N/Ti ratio is preferably not less than 1.2. In the titanium nitride film in this invention, since the effective work function value is increased in accordance with the increase of the film composition (N/Ti ratio), the titanium nitride film in this invention and the titanium nitride described in the Patent Document 4 (the effective work function is reduced with the increase of the film composition (N/Ti ratio)) are widely different in the phenomenon.

Figure 4:
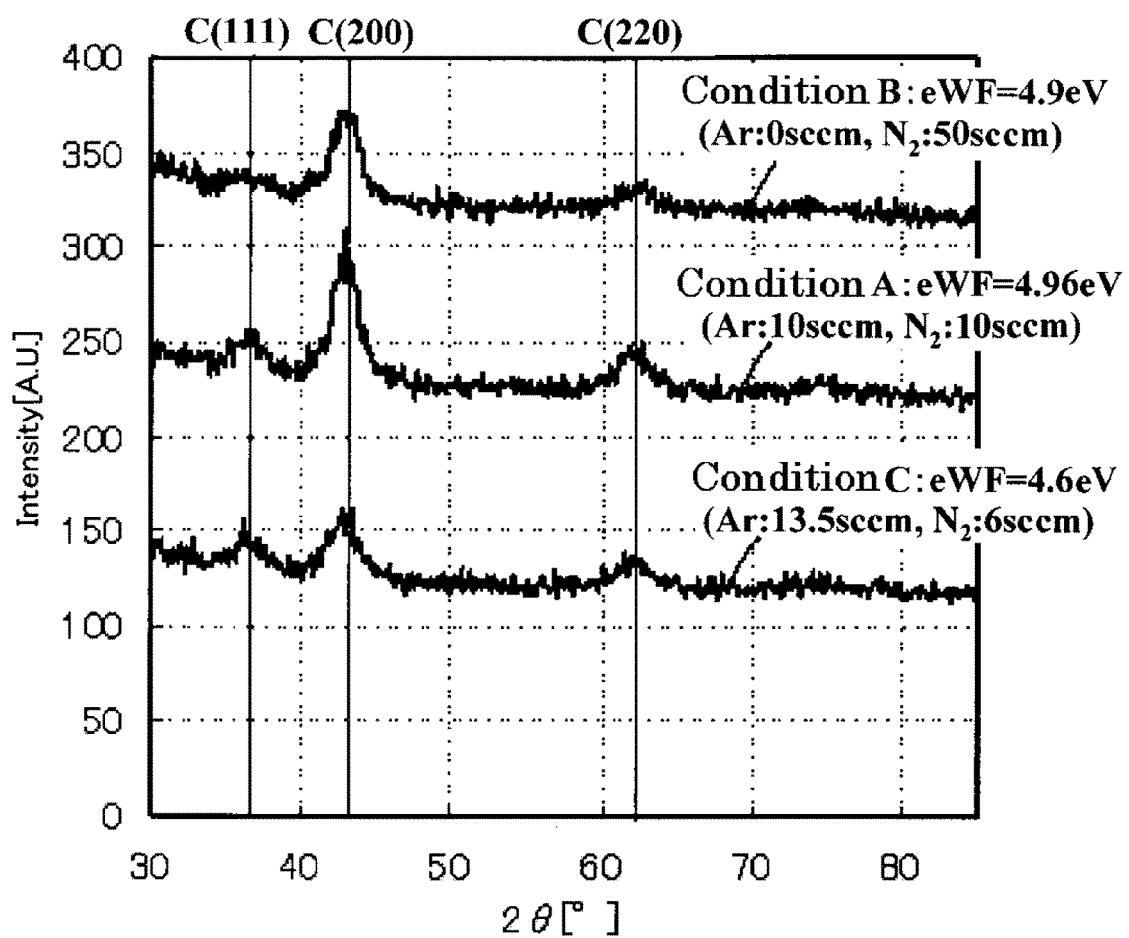
[FIG. 4] A view showing an XRD diffraction spectra of the titanium nitride film according to the embodiment of this invention.

FIG. 4 shows results obtained by comparing XRD diffraction spectrums of the titanium nitride films produced respectively in the conditions A, B, and C. The horizontal axis in FIG. 4 represents a diffraction angle, and the vertical axis represents diffraction intensity. C(111), C(200), and C(220) in FIG. 4 respectively represent a (111) plane, a (200) plane, and a (220) plane which are crystal faces of the titanium nitride film. As shown in FIG. 4, the titanium nitride films in the conditions A and B in which the film composition (N/Ti ratio) and the effective work function are high have a crystal structure in which the crystalline orientation in the (200) plane is high in comparison with the condition C in which the film composition (N/Ti ratio) and the effective work function are low.

Figure 5:
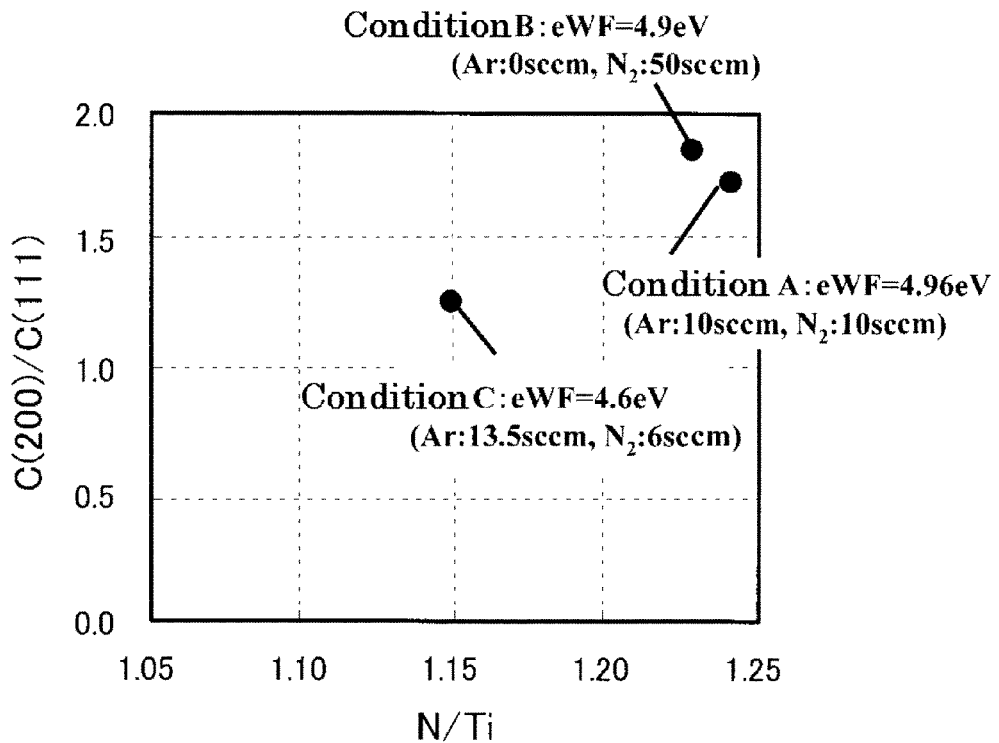
[FIG. 5] A view showing a relationship between a peak intensity ratio in the XRD diffraction spectrum and the film composition of the titanium nitride film according to the embodiment of this invention.

FIG. 5 shows results obtained by comparing the film composition (N/Ti ratio) of the titanium nitride film with a peak intensity ratio C(200)/C(111) (crystalline orientation) between the (111) plane and the (200) plane in an XRD spectrum. In FIG. 5, the horizontal axis represents the film composition of the titanium nitride film (N/Ti ratio), and the vertical axis represents the peak intensity ratio. As shown in FIG. 5, in the titanium nitride film in which the film compositions (N/Ti ratio) in the conditions A and B are not less than 1.2, the peak intensity ratio of the titanium nitride film is not less than 1.7 and thus the value is high. Meanwhile, the peak intensity ratio of the titanium nitride film in the condition B is not less than 1.8, and thus the titanium nitride film has a higher value in comparison with the condition A. Thus, in the titanium nitride film having a value of the effective work function of not less than 4.6 eV, the film composition (N/Ti ratio) is not less than 1.1, and the XRD diffraction spectrum peak intensity ratio C(200)/C(111) representing the crystalline orientation is not less than 1.1. In the titanium nitride film having a value of the effective work function of not less than 4.8 eV, the film composition (N/Ti ratio) is not less than 1.2, and the XRD diffraction spectrum peak intensity ratio C(200)/C(111) representing the crystalline orientation is not less than 1.7. In the titanium nitride film in this invention, even when the titanium nitride film has the crystalline orientation in the (200) plane, the effective work function value is 4.9 eV and thus the value is high. Therefore, it is shown that the titanium nitride film in this invention is different from the titanium nitride film disclosed in the Patent Document 3 (the value of the effective work function is 4.3 eV in the (100) orientation and 4.6 eV in the (111) orientation).

Figure 6:
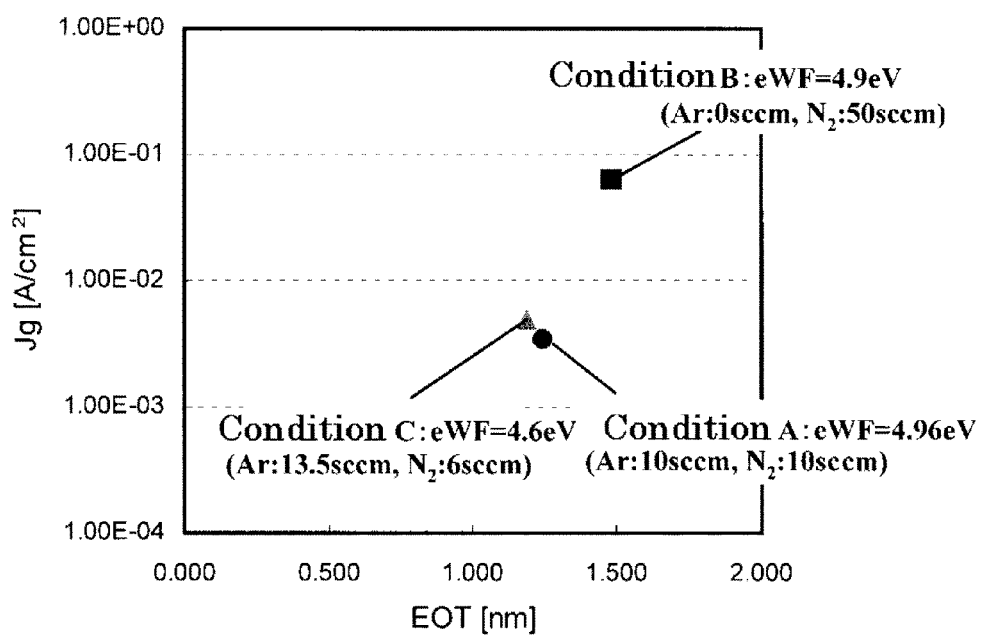
[FIG. 6] A view showing a relationship between EOT and leak current of an element according to the embodiment of this invention.

FIG. 6 shows a relationship between EOT (Equivalent Oxide Thickness, representing an $SiO_2$ equivalent film-thickness) and the leak current (Jg) of an element having the titanium nitride films produced in the conditions A, B, and C. As shown in FIG. 6, in comparison with the elements having the titanium nitride films in the conditions A and C, in the element having the titanium nitride film in the condition B, the EOT is increased by 0.2 nm, and the leak current (Jg) is increased by about one digit. This shows that although the titanium nitride film in the condition B has a high work function, the element characteristics may be reduced. The titanium nitride film in the condition B and the titanium nitride films in the conditions A and C are different in that the film density is low, and the peak intensity ratio C(200)/C(111) as an index of the crystalline orientation is not less than 1.8 and thus high. Here, when the electric properties of the element, which has the titanium nitride film having the effective work function value and the peak intensity ratio C(200)/C(111) equivalent to the condition C and having the film density equivalent to the condition B, is evaluated, as a result, it is confirmed that the EOT and the leak current value (Jg) are not deteriorated. Accordingly, it is considered that the EOT and the leak current in the element having the titanium nitride film in the condition B are increased due to the crystalline orientation.

Figure 7:
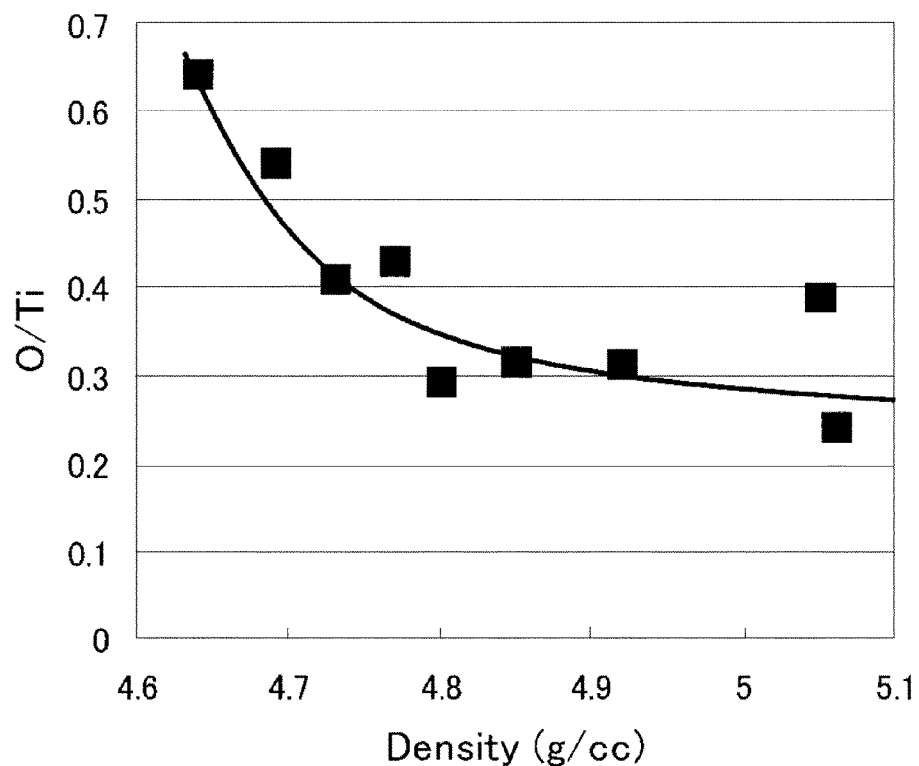
[FIG. 7] A view showing a relationship between the film composition and the film density of the titanium nitride film according to the embodiment of this invention.

FIG. 7 shows a relationship between the film composition (O/Ti ratio (molar ratio)) and the film density. Here, the produced sample is oxidized by being exposed to the air. As shown in FIG. 7, the O/Ti ratio is reduced with the increase of the film density. Since the oxidation of the titanium nitride film leads to the increase of specific resistance to deteriorate the element characteristics, it is shown that the film density of the titanium nitride film is preferably not less than 4.8 g/cc.

Figure 8:
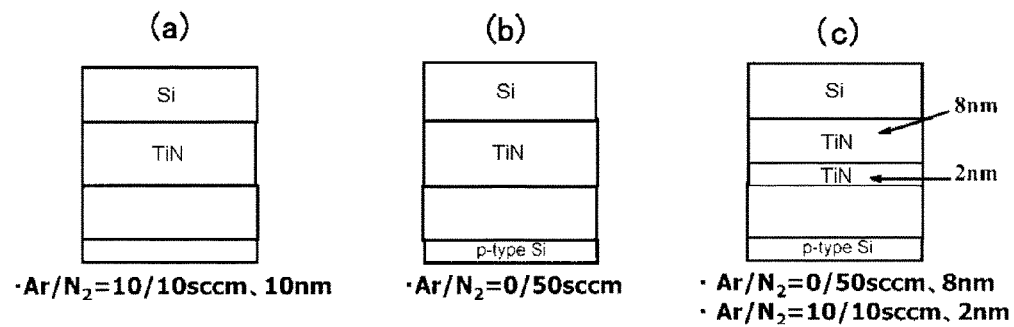
[FIG. 8] A cross-sectional view of an element structure according to the embodiment of this invention.

Next, the titanium nitride film in this invention, which suppresses the reduction of the work function in the thermal treatment process after the formation of the gate electrode, will described using an element of FIG. 8 as an example. The element structures of FIGS. 8A and 8B are the same as the element structure shown in FIG. 1, and the titanium nitride films are produced respectively in the conditions A and B. FIG. 8C is different from FIGS. 8A and 8B in that the titanium nitride film has a stacked film structure. In FIG. 8C, after a titanium nitride film with a film thickness of 2 nm is deposited on a gate insulating film in the condition A, a titanium nitride film with a film thickness of 8 nm is continuously deposited in the condition B in the same film-formation treatment chamber. The other conditions are the same as that of the element shown in FIG. 1.

Figure 9:
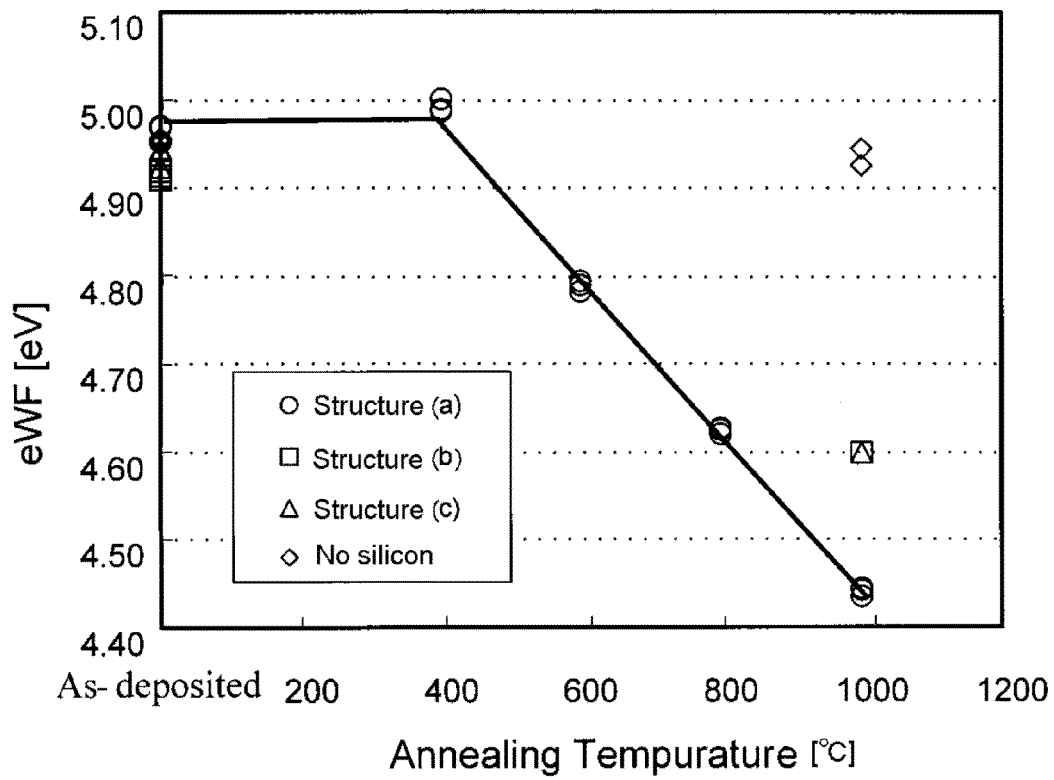
[FIG. 9] A view showing a relationship between a value of the effective work function of the element and an annealing temperature according to the embodiment of this invention.

FIG. 9 shows an annealing temperature dependency of the effective work function of the produced element. The structures (a), (b), and (c) in FIG. 9 correspond to the elements (a), (b), and (c) shown in FIG. 8, respectively. "No silicon" in FIG. 8 represents the element structure in which no silicon is deposited on titanium nitride of the element (a) of FIG. 8. As shown in FIG. 9, although the effective work function of the element has a value of not less than 4.9 eV in a state free from the annealing process (as-deposited), the effective work function is reduced by the annealing process at not less than 600° C. In the structure (a), the effective work function is reduced to 4.45 eV by the annealing process at 1000° C. Meanwhile, in the structures (b) and (c), although the effective work function is reduced by the annealing process at 1000° C., the structures (b) and (c) have 4.6 eV which is a value suitable for the P-type MOSFET. The effective work function of the element free from deposition of a silicon film on the titanium nitride film shows a high value of not less than 4.9 eV even if the annealing process at 1000° C. is applied. Therefore, it is considered that the reduction of the effective work function accompanying the annealing process is caused by the diffusion of silicon into the titanium nitride film, as described in the Patent Document 1. Thus, titanium nitride constituting the structures (b) and (c) has an effect of suppressing the diffusion of silicon into the titanium nitride film due to the annealing process, and it is shown that if the titanium nitride film deposited in the condition B exists in at least a region in contact with silicon, the effect can be secured. In this embodiment, although the value of the effective work function under the annealing condition at 1000° C. for 2 min is shown, it is confirmed that the change of the effective work function can be further suppressed under the activation annealing condition (at 1000° C. for 10 sec) in the production process of MOSFET.

The effective work function after the annealing at 1000° C. in the structure (a) has a value of not more than 4.6 eV suitable for the N-type MOSFET. Here, as the titanium nitride film of the element (a), the titanium nitride film, in which the molar ratio between Ti and N is not more than 1.1, and a crystalline orientation $X_3$ has a range of not more than 1.1, is deposited, and the effective work function after the annealing at 1000° C. is evaluated. As a result, it is confirmed that a value of 4.4 eV suitable for the N-type MOSFET is obtained.

Figure 10:
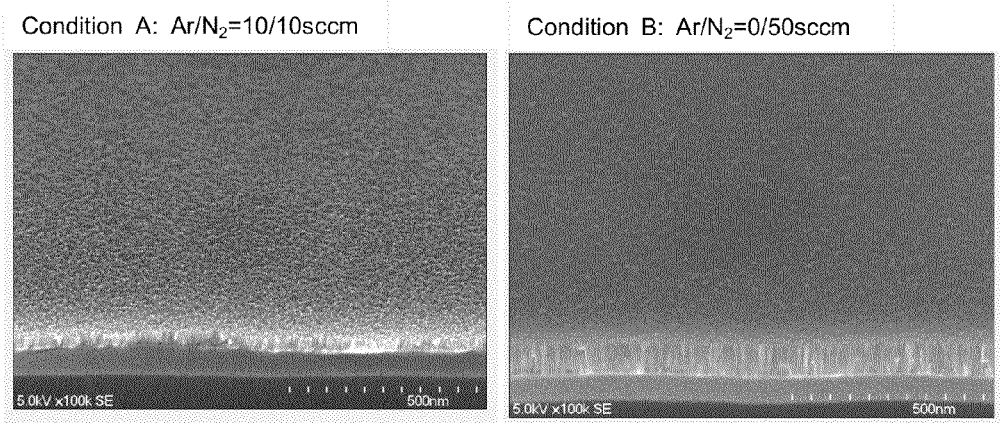
[FIG. 10] A view showing an SEM observation image of the titanium nitride film according to the embodiment of this invention.

FIG. 10 shows surface SEM images of the titanium nitride films deposited respectively in the conditions A and B. The titanium nitride film deposited in the condition A has a columnar structure with a grain size of approximately 20 nm and has a sharp concavoconvex surface due to a crystal face. The titanium nitride film deposited in the condition B has a columnar structure with a grain size of not more than 20 nm smaller than the condition A and has a highly flat surface in comparison with the condition A. The difference in crystal shape and surface flatness according to the deposition conditions of the titanium nitride film is the result of the crystalline orientation shown in FIG. 4. The titanium nitride film with the peak intensity ratio C(200)/C(111) of not less than 1.8 has a small grain size and a highly flat surface. It is considered that the difference in the value of the effective work function due to the differences between the titanium nitride films shown in FIG. 9 is related to the grain size and the surface flatness of the titanium nitride film. Namely, since the titanium nitride film in the condition B has a small grain size and a highly flat surface, the diffusion of silicon through a crystal grain boundary is prevented, and consequently the reduction of the effective work function is suppressed. The effect is similarly exerted also in the element (c) which has the titanium nitride film in the condition B in the region in contact with silicon. The Patent Document 2 discloses that the average crystal grain size of the titanium nitride film is not more than 30 nm, so that the variation of the threshold value voltages can be suppressed, and further describes that in the crystal structure of the titanium nitride film, when the TiN film in the (111) orientation is used, the variation of the threshold value voltages is small in comparison with the case of using the TiN film in which the (111) orientation and the (110) orientation coexist. Meanwhile, according to the present embodiment, the reduction of the effective work function contributing to the variation of the threshold value voltages is significantly influenced by not only the grain size of titanium nitride but also the surface flatness, and by virtue of the use of the titanium nitride in which the peak intensity ratio C(200)/C(111) in the XRD diffraction spectrum representing the crystalline orientation is not less than 1.8, the flatness can be improved, and the reduction of the effective work function can be suppressed. Thus, it is shown that the titanium nitride film in this invention is different from the titanium nitride film disclosed in the Patent Document 2.

Figure 11:
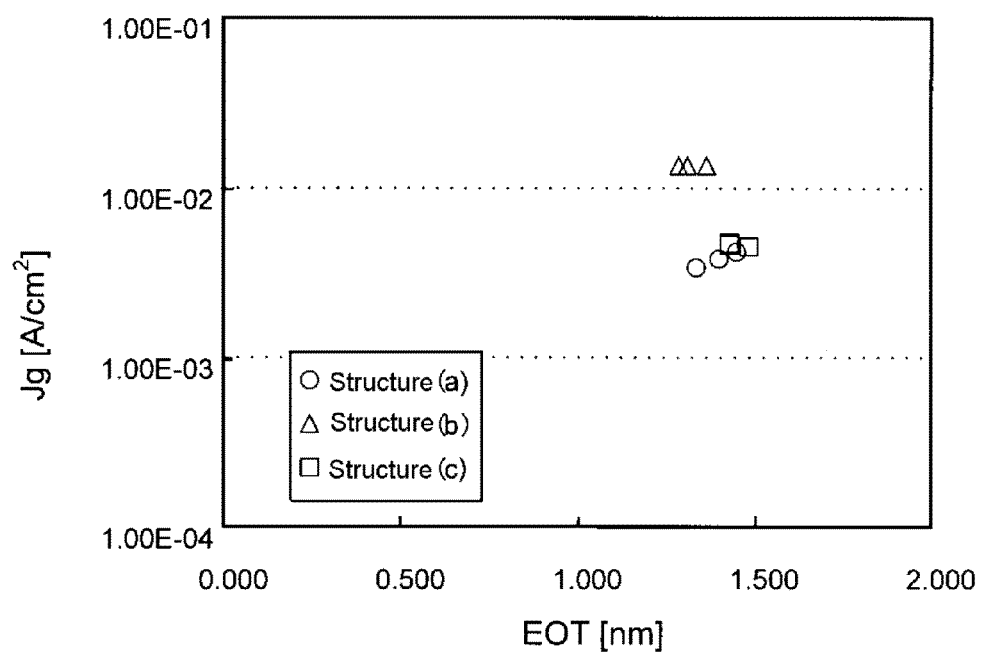
[FIG. 11] A view showing a relationship between the EOT and the leak current of the element according to the embodiment of this invention.

FIG. 11 shows a relationship between the EOT and the leak current (Jg) after annealing at 1000° C. As shown in FIG. 11, while the EOT and Jg of the elements (a) and (c) have approximately the same characteristics, Jg of the element (b) is larger by about one digit than that of the elements (a) and (c). As in the results shown in FIG. 6, the titanium nitride film of the element (b) leads to the deterioration of the electric properties of the element even through the annealing process at 1000° C. Namely, although the titanium nitride film of the element (b) can suppress the reduction of the effective work function due to the annealing process at 1000° C., it deteriorates the electric properties of the element, and therefore, it is not suitable for a titanium nitride film for a semiconductor device using the MIPS type gate electrode. Thus, to suppress the reduction of the effective work function value in the thermal treatment process after the formation of the gate electrode without leading to the deterioration of the electric properties, as shown in the element (c), it is shown that there is required a stacked structure which comprises a first metal nitride layer provided on a gate insulating film and containing Ti and N and a second metal nitride layer provided on the first metal nitride layer and containing Ti and N. In the first metal nitride layer in this invention, to realize a high work function by a sputtering method, the film composition (N/Ti ratio) and the crystalline orientation are optimized. In addition, in the second metal nitride layer, to suppress the reduction of the effective work function due to the diffusion of silicon by a sputtering method, the film composition (N/Ti ratio) and the crystalline orientation are optimized. In those points, the titanium nitride film in this invention is different from the titanium nitride film described in the Patent Document 1. Further, the stacked film of titanium nitride in this invention is different from the method described in the Patent Document 1 in that it is formed using a continuous process by sputtering in the same film-formation treatment chamber without increasing the substrate temperature upon deposition.

According to the above results, to realize the effective work function suitable for the P-type MSFET, the molar ratio between Ti and N (N/Ti) of the first metal nitride layer in this invention is preferably not less than 1.1, and particularly not less than 1.2. Further, to realize the effective work function suitable for the P-type MSFET and to prevent the deterioration of the element electric properties, the peak intensity ratio $X_1$ of C[200]/C[111] in the XRD spectrum representing the crystalline orientation of the first metal nitride layer is preferably within a range of $1.1 < X_1 < 1.8$. Furthermore, to prevent the deterioration of the element characteristics due to oxidation, the film density is preferably not less than 4.8 g/cc, and particularly not less than 5.0 g/cc.

Meanwhile, to suppress the reduction of the effective work function value due to the diffusion of silicon in the thermal treatment process after the formation of the gate electrode, the molar ratio between Ti and N (N/Ti) of the second metal nitride layer in this invention is preferably not less than 1.1, and particularly not less than 1.2. Further, the peak intensity ratio $X_2$ of C[200]/C[111] in the XRD spectrum representing the crystalline orientation of the second metal nitride layer is preferably within a range of 1.8≦$X_2$. Furthermore, to prevent the deterioration of the element characteristics due to oxidation, the film density is preferably not less than 4.8 g/cc.

Further, to suppress a change in the gate shape in silicon and titanium nitride caused by side etching due to the etching rate in an etching process of the gate electrode, the sum of the film thickness of the first metal nitride layer and the film thickness of the second metal nitride layer in this invention is preferably not more than 20 nm, and particularly not more than 10 nm. In this case, the film thickness of the first metal nitride layer preferably has a ratio of at least not less than 50% relative to the sum of the first metal nitride layer and the film thickness of the second metal nitride layer, and particularly a ratio of 80%.

Furthermore, to suppress the deterioration of the element characteristics due to plasma damage to the gate insulating film and to control the composition and the crystalline orientation, the deposition of the titanium nitride film in this invention is, as shown in FIG. 2, a process of magnetron-sputtering a Ti target under a mixed atmosphere of a reactive gas composed of nitrogen and an inert gas in a film-formation treatment chamber in which a target is provided at an offset position obliquely upward from a substrate. The blend ratio between the reactive gas and the inert gas is preferably set so that the molar ratio between Ti and N in the first metal nitride layer is not less than 1.1, and, at the same time, the crystalline orientation $X_1$ satisfies a range of $1.1<X_1<1.8$. Further, the blend ratio between the reactive gas and the inert gas is preferably set so that the molar ratio between Ti and N in the second metal nitride layer is not less than 1.1, and, at the same time, the crystalline orientation $X_2$ satisfies $1.8 \leq X_2$.

Furthermore, to improve throughput and suppress the oxidation of the titanium nitride film caused by air exposure, it is preferable to perform a process of forming the first metal nitride layer and a process of forming the second metal nitride layer in the same film-formation treatment chamber because the manufacturing method can be simplified.

Furthermore, in the above description, although the element having the gate insulating film using the silicon oxide film and the HfSiO film as a high-permittivity film has been described, this invention is not limited thereto, and the high-permittivity material used in the gate insulating film is a material having a relative permittivity larger than the relative ratio of $SiO_2$ (3.9) and includes a metal oxide, a metal silicate, a metal oxide introduced with nitrogen, and a metal silicate introduced with nitrogen. In terms of the suppression of crystallization and the improvement of the reliability of the element, preferred is a high-permittivity film introduced with nitrogen. As a metal in the high-permittivity material, preferred is Hf or Zr in terms of the heat resistance of a film and the suppression of fixed charge in a film. As the high-permittivity material, preferred are a metal oxide containing Hf or Zr and Si and a metal oxynitride which is the metal oxide further containing nitrogen, and more preferred are HfSiO and HfSiON. In this embodiment, although the silicon oxide film and the high-permittivity film stacked on the silicon oxide film are used as the gate insulating film, this invention is not limited thereto, and a high-permittivity insulating film can be used alone, or silicon oxynitride film and the high-permittivity film stacked on the silicon oxynitride film can be used.

Furthermore, in the above description, although there has been described the element having the MIPS type gate electrode, in which the titanium nitride film and the silicon film are formed on the p-type silicon substrate having on its surface the gate insulating film using the silicon oxide film and the HfSiO film as a high-permittivity film, this invention is not limited thereto. Also in the MOSFET element having the gate electrode comprising the MIPS structure shown in FIG. 12, if the titanium nitride film satisfying the conditions of this invention is included, the effects can be satisfactorily obtained.

Figure 15:
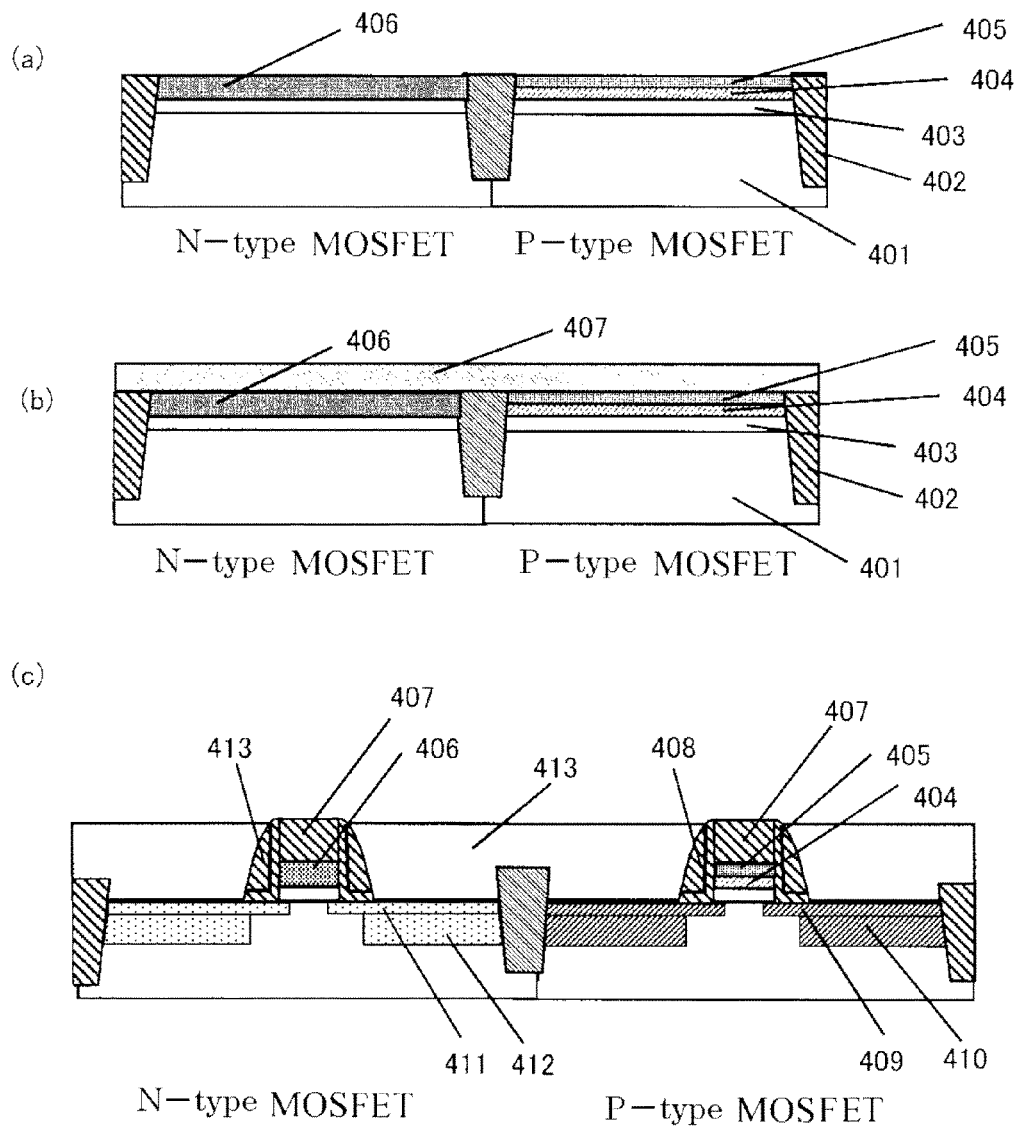
[FIG. 15] A view showing processes of a method of manufacturing a semiconductor device according to the Example 3 of this invention.

As shown in FIG. 15, when the N-type MOSFET is further provided on the silicon substrate, the N-type MOSFET has a gate insulating film and a gate electrode provided on the gate insulating film. It is preferable that the gate insulating film has a high-permittivity insulating film formed of a metal oxide, a metal silicate, a metal oxide introduced with nitrogen, or a metal silicate introduced with nitrogen, the gate electrode has a third metal nitride layer, which contains Ti and N and is provided on the gate insulating film, and a polycrystalline silicon layer provided on the third metal nitride layer, the molar ratio between Ti and N (N/Ti) in the third metal nitride layer is not more than 1.1, and the crystalline orientation $X_3$ is not more than 1.1.

Figure 16:
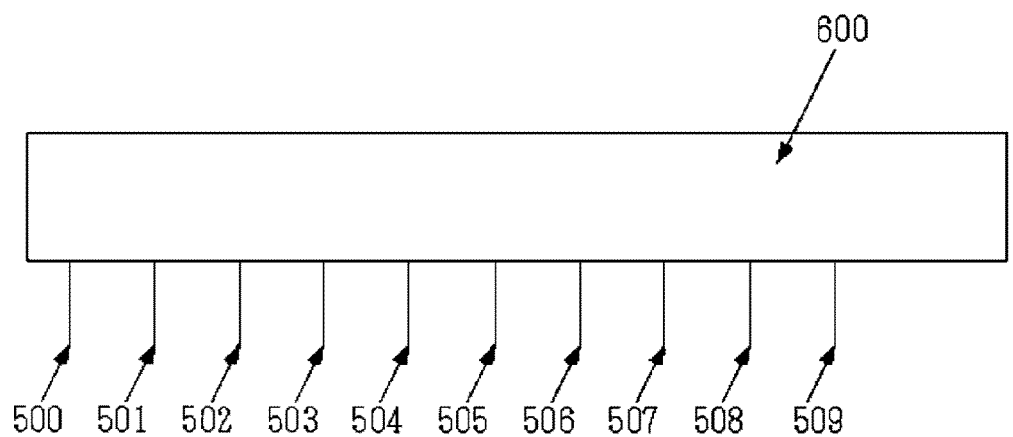
[FIG. 16] A schematic view of a controller controlling a processing apparatus of FIG. 2.

Next, a controller of the processing apparatus of FIG. 2 used in the process of forming the titanium nitride film of the present embodiment will be described. FIG. 16 is a schematic view of a controller controlling the processing apparatus of FIG. 2. Valves 202, 204, 206, and 208 can be controlled to be opened and closed by a controller 600 respectively through control input/output ports 500, 501, 502, and 503. Mass flow controllers 203 and 207 can adjust the flow rate by means of the controller 600 respectively through control input/output ports 504 and 505. In a conductance valve 117, the openness can be adjusted by the controller 600 through a control input/output port 506. The heater 105 can regulate temperature by means of the controller 600 through a control input/output port 507. For the rotational state of the substrate support pedestal 103, the number of rotations can be adjusted by the controller 600 through a control input/output port 508. In the DC power supply 110, the frequency and the supplying power can be adjusted by the controller 600 through an input/output port 509.

In this invention, the blend ratio between an inert gas such as an argon gas and a reactive gas composed of a nitrogen gas, which are introduced during sputtering film formation, is controlled by the controller 600 so that in the first metal nitride layer, the molar ratio between Ti and N (N/Ti) is not less than 1.1, and the crystalline orientation $X_1$ is $1.1<X_1<1.8$ and so that in the second metal nitride layer, the molar ratio between Ti and N (N/Ti) is not less than 1.1, and the crystalline orientation $X_2$ is $1.8 \leq X_2$.

Figure 17:
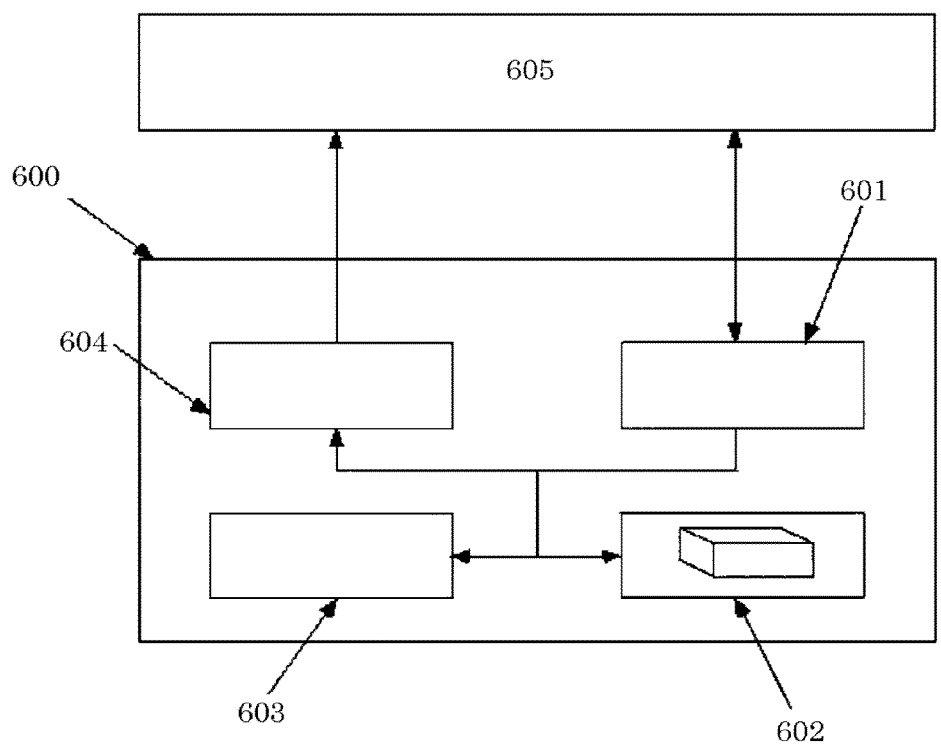
[FIG. 17] A view showing an internal constitution of the controller of FIG. 16.

FIG. 17 is a view showing an internal constitution of the controller 600 of FIG. 16. The controller 600 is constituted of an input part 601, a storage part 602 having programs and data, a processor 603, and an output part 604. The controller 600 basically has a computer configuration and controls the processor 605 of FIG. 2.

A manufacturing program of this invention is recorded in a computer (PC) readable recording medium and installed in the storage part 602 of the controller 600. Examples of the recording medium include a magnetic recording medium such as a floppy™ disk and ZIP™, a magneto-optical medium such as MO, and an optical disk such as CD-R, DVD-R, DVD+R, DVD-RAM, DVD+RW™, and PD. Examples of the recording medium further include a flash memory system such as a Compact Flash™, a SmartMedia™, a Memory Stick™, and an SD card and a removable disk such as a Microdrive™ and a Jaz™.

The manufacturing program of this invention installed in the storage part 602 is a manufacturing program of a semiconductor device comprising a field effect transistor provided on a silicon substrate and having a gate insulating film and a gate electrode. The gate electrode has a first metal nitride layer provided on the gate insulating film and containing Ti and N, a second metal nitride layer provided on the first metal nitride layer and containing Ti and N, and a polycrystalline silicon layer provided on the second metal nitride layer.

The manufacturing program of this invention causes a computer to execute a procedure for forming the first metal nitride layer, in which the molar ratio between Ti and N (N/Ti) is not less than 1.1, and the crystalline orientation $X_1$ is within a range of $1.1<X_1<1.8$, and a procedure for forming the second metal nitride layer, in which the molar ratio between Ti and N (N/Ti) is not less than 1.1, and the crystalline orientation $X_2$ is $1.8 \leq X_2$.

More specifically, in the procedure for forming the first metal nitride layer, when the Ti target is magnetron-sputtered under a mixed atmosphere of a reactive gas composed of nitrogen and an inert gas, the blend ratio between the reactive gas and the inert gas is controlled so that the molar ratio between Ti and N (N/Ti) in the metal nitride layer is not less than 1.1, and the crystalline orientation $X_1$ satisfies the range of $1.1<X_1<1.8$. In the procedure for forming the second metal nitride layer, when the Ti target is magnetron-sputtered under the mixed atmosphere of the reactive gas composed of nitrogen and the inert gas, the blend ratio between the reactive gas and the inert gas is controlled so that the molar ratio between Ti and N (N/Ti) in the metal nitride layer is not less than 1.1, and the crystalline orientation $X_2$ satisfies $1.8 \leq X_2$.

As a procedure for forming the gate insulating film, the manufacturing program of this invention may further have a procedure for heating a silicon substrate and depositing a metal film on a treated substrate by physical vapor deposition using a target and a procedure for supplying a gas containing an element oxidizing the metal film and oxidizing the metal film by a thermo-oxidative reaction to form a high-permittivity insulating film.

EXAMPLES

Example 1

A first example of this invention will be described in detail with reference to the drawings.

Figure 13:
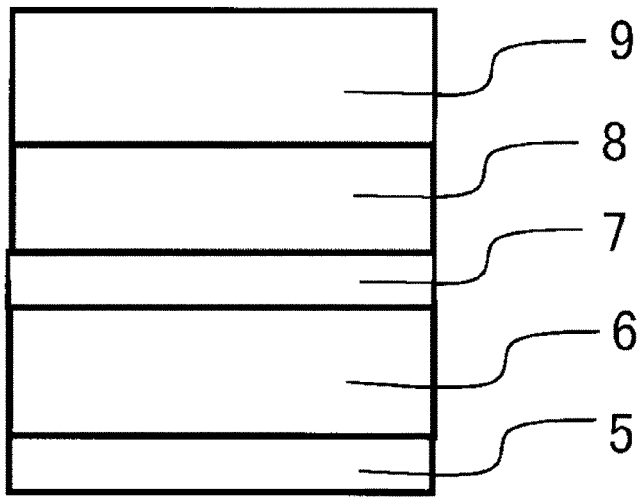
[FIG. 13] A view showing a cross-sectional structure of a semiconductor device according to the Example 1 of this invention.

FIG. 13 shows a schematic cross-section of an element structure having the MIPS type gate electrode according to the example 1. Hf with a film thickness of 0.5 to 0.7 nm is deposited on a silicon substrate 5, having on its surface a silicon oxide film with a film thickness of 1.8 nm, by a sputtering method. Thereafter, an annealing processing at 900° C. for 1 min is applied in an atmosphere with an oxygen partial pressure of 0.1 Pa, and Hf is diffused into the silicon oxide film, whereby a gate insulating film 6 having a stacked structure of the silicon oxide film and an HfSiO film is formed. Thereafter, in the processing apparatus shown in FIG. 2, a titanium nitride film 7 of 2 nm to 5 nm is deposited on the gate insulating film. In the titanium nitride film 7, the blend ratio between an argon gas flow rate and a nitrogen gas flow rate is regulated using a Ti metal target, whereby the molar ratio between Ti and N is not less than 1.1, and the crystalline orientation $X_1$ has the range of $1.1 < X_1 < 1.8$. Next, in the same film-formation treatment chamber, the blend ratio between the argon gas flow rate and the nitrogen gas flow rate is regulated, whereby a titanium nitride film 8 of 5 nm to 8 nm is deposited so that the molar ratio between Ti and N is not less than 1.1, and the crystalline orientation $X_2$ is $1.8 \leq X_2$. In the both cases, the sputtering power is 750 W, and the substrate temperature is 30° C. Then, a polycrystalline silicon 9 of 20 nm is deposited by the CVD method. Next, the annealing processing at 1000° C. for 2 min is performed in a nitrogen atmosphere.

Next, the TiN film is processed to have a desired size using a lithography technique and an RIE (Reactive Ion Etching) technique, and an element having the MIPS type gate electrode is formed.

The composition of the deposited titanium nitride film is analyzed by X-ray photoelectron spectroscopy (XPS). The crystalline orientation of the titanium nitride film is analyzed by an X-ray diffraction (XRD) method. The film density is analyzed by an X-ray reflectivity technique (X-ray reflect meter). The electric properties including the effective work function, EOT, and leak current characteristics are evaluated by C-V, I-V measurement.

As the results of the above evaluation, in an element having the MIPS type gate electrode including a titanium nitride film, which is the first metal nitride layer provided on the gate insulating film in this example and has the molar ratio between Ti and N of not less than 1.1 and the crystalline orientation $X_1$ of the range of $1.1 < X_1 < 1.8$, and a titanium nitride film, which is the second metal nitride layer and has the molar ratio between Ti and N of not less than 1.1 and the crystalline orientation $X_2$ of $1.8 \leq X_2$, it is confirmed that the effective work function (not less than 4.6 eV) suitable for the P-type MOSFET can be obtained without deterioration of EOT and leak current. Each film density of the first and second metal nitride layers is not less than 4.8 g/cc, and there is no reduction in the electric properties with the increase of specific resistance due to oxidation.

Also in an HfSiO film deposited as a gate insulating film by the CVD method, it is confirmed that similar effects are obtained.

After the deposition of HfSiO, even when an HfSiON film formed by a radical nitriding treatment is used as a gate insulating film, it is confirmed that similar effects are obtained.

Even when a material containing Zr as a gate insulating film and selected from a group consisting of ZrSiO, ZrSiON, HfZrSiO, and HfZrSiON is used, it is confirmed that similar effects are obtained.

Example 2

A second example of this invention will be described in detail with reference to the drawings.

Figure 12:
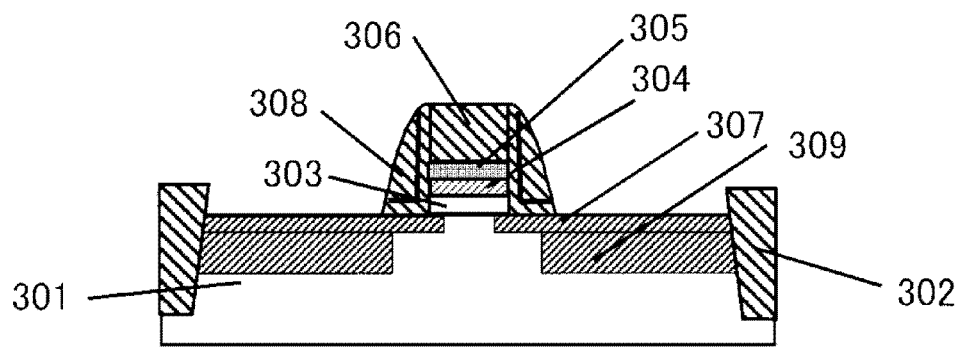
[FIG. 12] A cross-sectional view of an element structure according to the embodiment of this invention.
Figure 14:
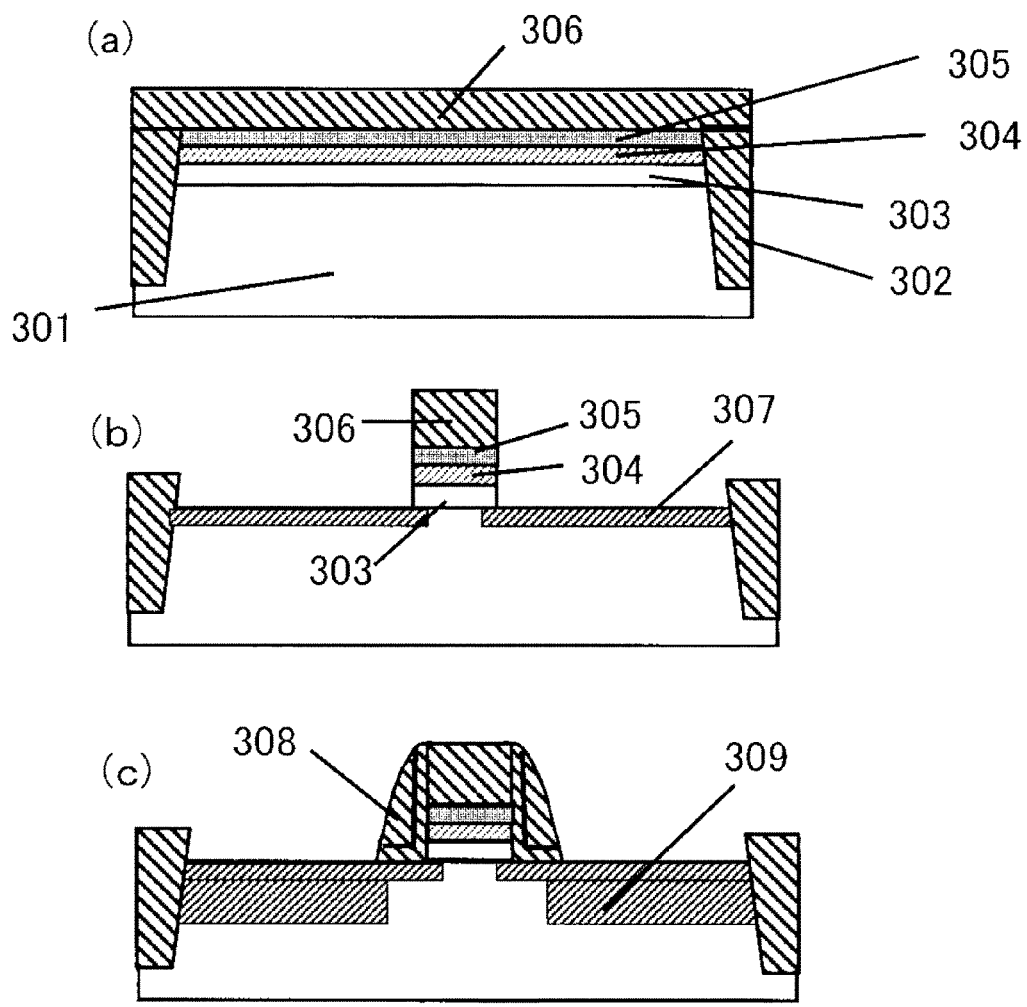
[FIG. 14] A view showing processes of a method of manufacturing a semiconductor device according to the Example 2 of this invention.

FIGS. 14(a) to 14(c) are views showing processes of a method of manufacturing a semiconductor device shown in FIG. 12 which is the second example of this invention. First, as shown in FIG. 14(a), an element isolation region 302 formed by an STI (Shallow Trench Isolation) technique is provided on the surface of a silicon substrate 301. Subsequently, a silicon thermal oxide film with a film thickness of 1.0 nm is formed on the element-isolated silicon substrate surface by a thermal oxidation method. Thereafter, an HfSiO film is deposited by the same method as in the example 1 to form a gate insulating film 303.

Next, a titanium nitride film (first metal nitride layer) 304 of 2 nm to 5 nm is deposited on the gate insulating film 303 by the same method as in the example 1. In the titanium nitride film 304, the blend ratio between the argon gas flow rate and the nitrogen gas flow rate is regulated using a Ti metal target, whereby the molar ratio between Ti and N is not less than 1.1, and the crystalline orientation $X_1$ has a range of $1.1 < X_1 < 1.8$. Next, a titanium nitride film (second metal nitride layer) 305 of 5 nm to 8 nm is deposited in the same film-formation treatment chamber so that the blend ratio between the argon gas flow rate and the nitrogen gas flow rate is regulated, whereby the molar ratio between Ti and N is not less than 1.1, and the crystalline orientation $X_2$ is $1.8 \leq X_2$.

Next, a silicon layer 306 with a film thickness of 20 nm is deposited, and thereafter, as shown in FIG. 14(b), the silicon layer 306 is processed into a gate electrode using the lithography technique and the RIE technique. Subsequently, ion implantation is performed, and an extension diffusion region 307 is formed in a self-aligned manner by using the gate electrode as a mask.

Further, as shown in FIG. 14(c), a silicon nitride film and a silicon oxide film are sequentially deposited and thereafter etch-backed to thereby form a gate side wall 308. In this state, the ion implantation is performed again, and a source/drain diffusion layer 309 is formed through activation annealing.

As a result of evaluation of the electric properties of the produced element, it is confirmed that the effective work function (not less than 4.6 eV) suitable for the P-type MOSFET can be obtained without deterioration of EOT and leak current.

Also in an HfSiO film deposited as a gate insulating film by the CVD method, it is confirmed that similar effects are obtained.

After the deposition of HfSiO, even when an HfSiON film formed by the radical nitriding treatment is used as a gate insulating film, it is confirmed that similar effects are obtained.

Even when a material containing Zr as a gate insulating film and selected from a group consisting of ZrSiO, ZrSiON, HfZrSiO, and HfZrSiON is used, it is confirmed that similar effects are obtained.

As described above, also in the MOSFET element constituted of the MIPS type gate electrode in this embodiment, it is confirmed that the effects of this invention are obtained.

Example 3

FIGS. 15(a) to 15(c) are views showing processes of a method of manufacturing a semiconductor device which is the third example of this invention. First, as shown in FIG. 15(a), an element isolation region 402 formed by the STI (Shallow Trench Isolation) technique is provided on the surface of a silicon substrate 401, and an N-type MOSFET region and a P-type MOSFET region are separated from each other. Subsequently, a silicon thermal oxide film with a film thickness of 1.0 nm is formed on the element-isolated silicon substrate surface by a thermal oxidation method. Thereafter, an HfSiO film is deposited by the same method as in the example 1 to form a gate insulating film 903.

Next, a titanium nitride film (first metal nitride layer) 404 of 2 nm is deposited on the gate insulating film in the P-type MOSFET region by using the processing apparatus shown in FIG. 2. In the titanium nitride film 404, the blend ratio between the argon gas flow rate and the nitrogen gas flow rate is regulated, whereby the molar ratio between Ti and N is not less than 1.1, and the crystalline orientation $X_1$ has a range of $1.1 < X_1 < 1.8$. Next, a titanium nitride film (second metal nitride layer) 405 of 8 nm is deposited in the same film-formation treatment chamber so that the blend ratio between the argon gas flow rate and the nitrogen gas flow rate is regulated, whereby the molar ratio between Ti and N is not less than 1.1, and the crystalline orientation $X_2$ is $1.8 \leq X_2$. In the both cases, the sputtering power is 750 W, and the substrate temperature is 30° C.

Next, a titanium nitride film (third metal nitride layer) 406 of 10 nm is deposited on the gate insulating film in the N-type MOSFET region by using the processing apparatus shown in FIG. 2. In the titanium nitride film 406, the blend ratio between the argon gas flow rate and the nitrogen gas flow rate is regulated, whereby the molar ratio between Ti and N is not more than 1.1, and the crystalline orientation $X_3$ has a range of not more than 1.1.

Next, as shown in FIG. 15(b), a silicon layer 407 with a film thickness of 20 nm is formed.

Next, the silicon layer 407 is processed into a gate electrode in the P-type MOSFET region using the lithography technique and the RIE technique. Subsequently, ion implantation is performed, and an extension diffusion region 409 is formed in a self-aligned manner by using the gate electrode as a mask. Further, a silicon nitride film and a silicon oxide film are sequentially deposited and thereafter etch-backed to thereby form a gate side wall 408. In this state, the ion implantation is performed again, and a source/drain diffusion layer 410 is formed through activation annealing.

Next, a gate electrode in the N-type MOSFET region is processed using the lithography technique and the RIE technique. Subsequently, ion implantation is performed, and an extension diffusion region 411 is formed in a self-aligned manner by using the gate electrode as a mask. Further, a silicon nitride film and a silicon oxide film are sequentially deposited and thereafter etch-backed to thereby form a gate side wall 413. In this state, the ion implantation is performed again, and a source/drain diffusion layer 408 is formed through activation annealing, whereby a semiconductor device shown in FIG. 15(c) is fabricated.

As a result of evaluation of the electric properties of the produced element, in the P-type MOSFET, it is confirmed that the effective work function (not less than 4.6 eV) suitable for the P-type MOSFET can be obtained without deterioration of EOT and leak current. In the N-type MOSFET, it is confirmed that the effective work function (not more than 4.4 eV) suitable for the N-type MOSFET can be obtained without deterioration of EOT and leak current.

Also in an HfSiO film deposited as a gate insulating film by the CVD method, it is confirmed that similar effects are obtained.

After the deposition of HfSiO, even when an HfSiON film formed by the radical nitriding treatment is used as a gate insulating film, it is confirmed that similar effects are obtained.

Even when a material containing Zr as a gate insulating film and selected from a group consisting of ZrSiO, ZrSiON, HfZrSiO, and HfZrSiON is used, it is confirmed that similar effects are obtained.

As described above, also in a CMOSFET element constituted of the MIPS type gate electrode in this embodiment, it is confirmed that the effects of this invention are obtained.

Description of Reference Numerals 1 silicon substrate
2 gate insulating film
3 titanium nitride film
4 silicon film
5 silicon substrate
6 gate insulating film
7 first metal nitride layer
8 second metal nitride layer
9 silicon film
100 film-formation treatment chamber
101 heater
102 treated substrate
103 substrate support pedestal
104 susceptor
105 heater
106 metal target
107 back plate
108 target holder
109 insulator
110 DC power supply
111 magnet
112 magnet holder
116 shield
117 conductance valve
118 exhaust pump
201 inert gas supply
202 valve
203 mass flow controller
204 valve
205 reactive gas supply
206 valve
207 mass flow controller
208 valve
301 silicon substrate
302 element isolation region
303 gate insulating film
304 first metal nitride layer
305 second metal nitride layer
306 silicon layer 307 extension region
308 gate side wall
309 source/drain region
401 silicon substrate
402 element isolation region
403 gate insulating film
404 first metal nitride layer
405 second metal nitride layer
406 third metal nitride layer
407 silicon layer
408 gate side wall
409 extension region
410 source/drain region
411 extension region
412 source/drain region
413 inter-layer insulating film

The invention claimed is:

1. A semiconductor device, which comprises a field effect transistor provided on a silicon substrate and having a gate insulating film and a first gate electrode provided on the gate insulating film,
wherein the gate insulating film has a high-permittivity insulating film formed of a metal oxide, a metal silicate, a metal oxide introduced with nitrogen, or a metal silicate introduced with nitrogen,
the first gate electrode has a first metal nitride layer provided on the gate insulating film and containing Ti and N, a second metal nitride layer provided on the first metal nitride layer and containing Ti and N, and a first polycrystalline silicon layer provided on the second metal nitride layer,
in the first metal nitride layer, a molar ratio of N to Ti (N/Ti) is not less than 1.1, and a first crystalline orientation X1 is $1.1<X1<1.8$, where X1 is a first ratio of C200 to C111, and C200 and C111 are the peak intensity measurements of the respective 200 and 111 crystal orientations from the x-ray diffraction of the first metal nitride layer, and in the second metal nitride layer, the molar ratio of N to Ti (N/Ti) is not less than 1.1, and a second crystalline orientation X2 is $1.8 \leq X2$, where X2 is a second ratio of C200 to C111, and C200 and C111 are the peak intensity measurements of the respective 200 and 111 crystal orientations from the x-ray diffraction of the second metal nitride layer.

2. The semiconductor device according to claim 1, wherein the field effect transistor is a P-type MOSFET.

3. The semiconductor device according to claim 2, further comprising an N-type MOSFET provided on the silicon substrate, wherein the N-type MOSFET has the gate insulating film and a second gate electrode provided on the gate insulating film, the gate insulating film has a high-permittivity insulating film formed of a metal oxide, a metal silicate, a metal oxide introduced with nitrogen, or a metal silicate introduced with nitrogen, the gate electrode has a third metal nitride layer provided on the gate insulating film and containing Ti and N and a second polycrystalline silicon layer provided on the third metal nitride layer, and in the third metal nitride layer, the molar ratio of N to Ti (N/Ti) is not more than 1.1, and a third crystalline orientation X3 is not more than 1.1, where X3 is the third ratio of C200 to C111, and C200 and C111 are the peak intensity measurements of the respective 200 and 111 crystal orientations from the x-ray diffraction of the third metal nitride layer.

4. The semiconductor device according to claim 1 wherein each molar ratio of N to Ti of the first metal nitride layer and the second metal nitride layers is not less than 1.2.

5. The semiconductor device according to claim 1, wherein each film density of the first metal nitride layer and the second metal nitride layer is not less than 4.8 g/cc.

6. The semiconductor device according to claim 1, wherein the sum of the film thickness of the first metal nitride layer and the film thickness of the second metal nitride layer is not more than 20 nm.

7. The semiconductor device according to claim 1, wherein the high-permittivity insulating film has an insulating film containing Hf or Zr.

8. The semiconductor device according to claim 1, wherein the gate insulating film has a stacked structure comprising a silicon oxide film or a silicon oxynitride film and a layer containing Hf or Zr.

9. A method of manufacturing a semiconductor device, which comprises a field effect transistor provided on a silicon substrate and having a gate insulating film which has a high-permittivity insulating film formed of a metal oxide, a metal silicate, a metal oxide introduced with nitrogen, or a metal silicate introduced with nitrogen and a gate electrode which has a first metal nitride layer provided on the gate insulating film and containing Ti and N, a second metal nitride layer provided on the first metal nitride layer and containing Ti and N, and a polycrystalline silicon layer provided on the second metal nitride layer, the method comprising the steps of:
forming the first metal nitride layer in which a molar ratio between Ti and N (N/Ti) is not less than 1.1, and a crystalline orientation X1 is within a range of $1.1<X1<1.8$, where X1 is a first ratio of C200 to C111, and C200 and C111 are the peak intensity measurements of the respective 200 and 111 crystal orientations from the x-ray diffraction of the first metal nitride layer; and
forming the second metal nitride layer in which the molar ratio of N to Ti (N/Ti) is not less than 1.1, and a crystalline orientation X2 is 1.8 X2, where X2 is a second ratio of C200 to C111, and C200 and C111 are the peak intensity measurements of the respective 200 and 111 crystal orientations from the x-ray diffraction of the second metal nitride layer.

10. The method of manufacturing a semiconductor device, according to claim 9, wherein the step of forming the first metal nitride layer and the step of forming the second metal nitride layer are a step of magnetron-sputtering a Ti target under a mixed atmosphere of a reactive gas composed of nitrogen and an inert gas, in the step of forming the first metal nitride layer, the blend ratio between the reactive gas and the inert gas is set so that the molar ratio of N to Ti (N/Ti) in the first metal nitride layer is not less than 1.1, and the crystalline orientation X1 satisfies the range of $1.1<X1<1.8$,
in the step of forming the second metal nitride layer, the blend ratio between the reactive gas and the inert gas is set so that the molar ratio of N to Ti (N/Ti) in the second metal nitride layer is not less than 1.1, and the crystalline orientation X2 satisfies $1.8 \leq X2$.

11. The method of manufacturing a semiconductor device, according to claim 10, wherein the step of forming the first metal nitride layer and the step of forming the second metal nitride layer are performed in the same film-formation treatment chamber.

12. A computer readable recording medium having a program for manufacturing a semiconductor device, which comprises a field effect transistor provided on a silicon substrate and having a gate insulating film which has a high-permittivity insulating film formed of a metal oxide, a metal silicate, a metal oxide introduced with nitrogen, or a metal silicate introduced with nitrogen and a gate electrode which has a first metal nitride layer provided on the gate insulating film and containing Ti and N, a second metal nitride layer provided on the first metal nitride layer and containing Ti and N, and a polycrystalline silicon layer provided on the second metal nitride layer, wherein the program causing a computer to execute: a procedure for forming the first metal nitride layer in which the molar ratio of N to Ti (N/Ti) is not less than 1.1, and a crystalline orientation X1 is within a range of $1.1 < X1 < 1.8$ where X1 is a first ratio of C200 to C111, and C200 and C111 are the peak intensity measurements of the respective 200 and 111 crystal orientations from the x-ray diffraction of the first metal nitride layer;

and a procedure for forming the second metal nitride layer in which the molar ratio of N to Ti (N/Ti) is not less 1.1, and a crystalline orientation X2 is $1.8 \leq X2$, where X2 is a second ratio of C200 to C111, and C200 and C111 are the peak intensity measurements of the respective 200 and 111 crystal orientations from the x-ray diffraction of the second metal nitride layer.

13. The computer readable recording medium, according to claim 12, wherein in the procedure for forming the first metal nitride layer, when a Ti target is magnetron-sputtered under a mixed atmosphere of a reactive gas composed of nitrogen and an inert gas, a blend ratio between the reactive gas and the inert gas is controlled so that the molar ratio of N to Ti (N/Ti) in the first metal nitride layer is not less than 1.1, and the crystalline orientation X1 satisfies the range of $1.1 < X1 < 1.8$, and in the procedure for forming the second metal nitride layer, when the Ti target is magnetron-sputtered under the mixed atmosphere of the reactive gas composed of nitrogen and the inert gas, the blend ratio between the reactive gas and the inert gas is controlled so that the molar ratio of N to Ti (N/Ti) in the second metal nitride layer is not less than 1.1, and the crystalline orientation X2 satisfies 1.8 X2.

* * * * *